US008295316B2

(12) United States Patent
Akins et al.

(10) Patent No.: US 8,295,316 B2
(45) Date of Patent: Oct. 23, 2012

(54) METHOD AND SYSTEM FOR MANAGING LIGHT SOURCE OPERATION

(75) Inventors: Robert P. Akins, Escondido, CA (US); Richard L. Sandstrom, Encinitas, CA (US); Daniel J. W. Brown, San Diego, CA (US); Matthew R. Graham, San Diego, CA (US); Kevin W. Zhang, San Diego, CA (US); Patrick L. Nelissen, Ramona, CA (US)

(73) Assignee: Cymer, Inc., San Diego, CA (US)

( * ) Notice: Subject to any disclaimer, the term of this patent is extended or adjusted under 35 U.S.C. 154(b) by 292 days.

(21) Appl. No.: 12/730,506

(22) Filed: Mar. 24, 2010

(65) Prior Publication Data

US 2011/0235663 A1  Sep. 29, 2011

(51) Int. Cl.
*H01S 3/13* (2006.01)

(52) U.S. Cl. ............... 372/29.014; 372/29.015; 372/55; 372/56; 372/59

(58) Field of Classification Search ............ 372/29.014, 372/29.015, 29.021, 30, 55, 56, 57, 58, 59, 372/60, 61, 62, 63, 64, 65, 81, 82, 83, 84, 372/85, 86, 87, 88
See application file for complete search history.

(56) References Cited

U.S. PATENT DOCUMENTS

| 3,383,491 | A | * | 5/1968 | Muncheryan | 219/121.63 |
| 4,959,840 | A | | 9/1990 | Akins et al. | |
| 5,544,182 | A | * | 8/1996 | Nagaishi et al. | 372/29.021 |
| 5,673,282 | A | * | 9/1997 | Wurst | 372/38.09 |
| 5,887,014 | A | | 3/1999 | Das | |
| 5,936,988 | A | | 8/1999 | Partlo et al. | |
| 6,330,267 | B1 | * | 12/2001 | Vogler et al. | 372/59 |
| 7,949,025 | B2 | * | 5/2011 | Olea | 372/38.02 |
| 2006/0056478 | A1 | * | 3/2006 | Albrecht et al. | 372/55 |
| 2007/0213697 | A1 | * | 9/2007 | Holliday | 606/10 |

* cited by examiner

*Primary Examiner* — Jessica Stultz
*Assistant Examiner* — Joshua King
(74) *Attorney, Agent, or Firm* — Gard & Kaslow LLP

(57) ABSTRACT

A laser light source experiencing an EOL condition, which might otherwise cause an unscheduled shutdown, is instead operated in a diminished capacity in one or more predetermined or calculated increments. Operating in such diminished capacity continues until the laser system can undergo appropriate maintenance either during a regularly scheduled shutdown or a newly scheduled shutdown. In the meantime, the diminished capacity of the laser system is accommodated by the utilization tool, as appropriate.

11 Claims, 6 Drawing Sheets

FIG. 6

| Maint. Action | HVEP Calibration | | | | LOT-Start |
|---|---|---|---|---|---|
| External HV / Internal Energy | XXX | | | | |
| Scanner Energy Mode | | | | | |
| Scanner Set Energy Command and Reply | COMMAND SE=11.25 / REPLY SE=11.25 | | SE=10.25 / SE=10.25 | | |
| Scanner Get Voltage Query and Reply | | QUERY HV? / REPLY HV=995 | | HV? / HV=975 | |
| Derating Factor Approved by Scanner | | | DF=0.90 | | |
| Laser Exposure Energy | | 11.25mJ*0.90 / ~10.125mJ | 10.25mJ*0.90 / ~9.225mJ | | 11.25mJ*0.90 / ~10.125mJ |

HVEP Calibration Sequence

METHOD AND SYSTEM FOR MANAGING LIGHT SOURCE OPERATION

FIELD OF THE DISCLOSURE

The present disclosure is generally related to laser technology for photolithography and, more particularly, to controlling operation of a laser light source at or near an end of life condition.

BACKGROUND OF THE DISCLOSURE

With advances in technology, gas discharge laser light sources operate reliably for several billions of pulses. However, as the laser system operates, the gas gain medium, typically a mixture of a halogen gas, a noble gas, and a buffer gas (e.g., fluorine, argon, and neon, or other known gases), becomes depleted of the halogen gas and accumulates debris. This reduction in the halogen gas degrades gain in the discharge medium. To compensate, discharge voltage is increased over the life of the gas to maintain a constant output pulse energy level.

In addition, if the debris is not effectively removed from the discharge area (by, e.g., gas circulation around the chamber) between subsequent discharges, a phenomenon known as arcing can occur. Arcing results in non-uniform discharges. Arcing also reduces the energy delivered to the gas gain medium for causing lasing and thus reduces and destabilizes the output pulse energy. This is a problem because the level and stability of output pulse energy are crucial in many laser applications, especially so in integrated circuit photolithography where arcing can negatively affect device yield and performance.

Other factors can also affect output pulse energy such as electrode erosion, which can both affect the discharge and create more debris.

These issues and the basic operation and control of a laser light source, including the relationship between electrode voltage control and output pulse energy, are known in the art (see, e.g., commonly-assigned U.S. Pat. No. 5,887,014, entitled PROCESS FOR SELECTING OPERATING RANGE FOR NARROW BAND EXCIMER LASER, issued to Das on Mar. 23, 1999). The '014 patent in turn incorporates the teachings of commonly-assigned U.S. Pat. No. 4,959,840, entitled COMPACT EXCIMER LASER INCLUDING AN ELECTRODE MOUNTED IN INSULATING RELATIONSHIP TO WALL OF THE LASER, issued to Akins et al. on Sep. 25, 1990.

The earlier '840 patent describes a halogen gas photolithography deep ultraviolet (DUV) laser light source having a "pair of spaced electrodes [that] are located within the laser cavity and form an electrical discharge area between the electrodes for stimulating gas within the discharge area to lasing action in accordance with an electrical discharge between the electrodes." ('840 patent, Abstract) The '840 patent teaching that such DUV laser light sources can control laser output pulse energy by controlling the voltage applied to the electrodes was elaborated upon by the '014 patent teaching that such voltage control is at least one form of output pulse energy control:

"[i]t is known that within the normal operating range of the KrF laser, output pulse energy can be increased by increasing the pulse discharge voltage; and it can be increased by increasing the fluorine concentration. Increases or decreases in both or either of these parameters is easily accomplished with these narrow band KrF excimer lasers."

('014 patent, Col. 1, lines 32-37)

The production and control of the voltage delivered to the electrodes of such a DUV laser photolithography light source using a step-up transformer is described in U.S. Pat. No. 5,936,988, entitled HIGH PULSE RATE PULSE POWER SYSTEM, issued to Partlo, et al. on Aug. 10, 1999. The '988 patent discloses a high repetition rate, high voltage power supply for a DUV laser photolithography light system operating at about 2000 pulses per second, and therefore, creating discharges between the electrodes at that same rate. ('988 patent, Abstract)

The '988 patent also discloses a pulse energy controller that uses a photodiode to monitor output pulse by comparing a current energy signal with historical pulse energy data to set a command voltage for the next pulse. ('988 patent, Col. 4, line 43-Col. 5, line 17)

The '014 patent also teaches maintaining constant output light pulse energy in the face of changing fluorine concentration in the laser gas. In particular, the '014 patent states that:

"[a] typical operating plan for producing constant laser pulses is to compensate for the fluorine depletion by increases in the discharge voltage. This is accomplished with a feedback control which monitors pulse energy on a 'per pulse' basis at pulse frequencies such as 1,000 Hz and controls the voltage to maintain substantially constant pulse energy as the fluorine concentration decreases over time. Normally the operating plan will encompass a voltage control range so that when the voltage increases to compensate for the depleted fluorine, reaches an 'upper limit' (usually requiring a period of about two hours), a quantity of fluorine is injected during a period of a few seconds. The quantity injected is predetermined to correspond to roughly to the quantity which would have been depleted over the two hour period. During the fluorine injection period, the automatic feed back control will force the voltage down in order to keep pulse energy substantially constant so that at the end of the injection period the voltage is approximately at the low level of the voltage operating range and fluorine pressure is approximately at its high level."

('014 patent, Col. 1, lines 44-63)

The '014 patent also recognizes that these issues ultimately affect the continued use of a laser system by stating that "the operating life of the laser is adversely affected by increased fluorine concentration and also by increased discharge voltage." ('014 patent, Col. 2, lines 42-44).

Demands for better response to fluorine consumption and its affect on laser operations, laser gas life (time between gas refills) and laser chamber life (time to chamber replacement) have been addressed, at least in part, by improvements in laser control systems that deliver longer operating life until an "end of life" ("EOL") condition occurs. Such laser control system improvements include better gas injection control, better management of debris over time, and better estimation of operating parameters and EOL prediction algorithms.

Despite these advances, the basic approach of using voltage control to maintain laser system output pulse energy in response to diminishing fluorine concentration and increasing debris in the chamber has not changed. As a result, current laser control systems still typically respond to diminishing fluorine concentration by increasing the discharge voltage.

However, as higher and higher discharge voltages are commanded, at some point the discharge voltage can exceed power supply design limits and capabilities. This can disturb pulse energy and pulse energy stability along with the occurrence of arcing through the combination of high debris in the gas and higher charging voltage. The laser controller treats any of the foregoing as EOL conditions that result in either 1) an error message being sent to a tool utilizing the laser (e.g., a scanner) or 2) laser system and/or tool shutdown for some maintenance procedure to be performed to eliminate the cause of the EOL condition, or both.

Typically the determination to issue an EOL alarm or shut down the laser, either of which cause an automatic or manual shutdown of a utilizing tool, such as a scanner, can be made by the laser system, tool or both. The determination may be based on one or more current operating conditions which the controller(s) evaluates based on historical data which indicate the existence of or a trend toward an out of specification condition, in order to prevent the out of specification condition from actually occurring.

The EOL condition may call for a single maintenance action, such as a laser chamber gas refill which requires shutting down the laser light source system, or the replacement of the chamber itself. Additionally the maintenance called for may require the replacement of other laser system modules, such as the optics module, power supply module, or the like. Previously, EOL conditions relating to the laser gas, laser chamber, or other laser subsystems have occurred at unanticipated times. Consequently, the utilizing tool is subjected to an unanticipated or unscheduled shutdown with consequent throughput losses.

What is therefore needed is an improved approach to dealing with end of life conditions that avoids such unscheduled shutdowns.

SUMMARY OF THE DISCLOSURE

The present disclosure provides systems and methods for maintaining operation of a photolithography laser light source when condition(s) in a laser chamber or other module or component reach or approach an end of a life ("EOL") condition. The system may in one example contain a programmable device in communication with the laser. The programmable device can at least partially control a pulse energy output level for the laser light source by controlling discharge voltage. The programmable device is programmed with an initial pulse energy output level nominal correction factor. An input source in communication with the programmable device may communicate a status of a characteristic of the laser, such as discharge voltage, to the programmable device. A prescribed value or change in/trend of the characteristic of the laser can also be programmed into the programmable device. A first and subsequent correction factors programmed into the programmable device can be used to repeatedly diminish the pulse energy output level by the first correction factor after the characteristic of the laser meets or exceeds the prescribed value or the change in/trend in the characteristic indicates the threshold is about to be met or exceeded.

A method of controlling a photolithography laser light source experiencing an end of life condition, whereby the laser light source or the utilization tool would ordinarily need to be shut down because the output light characteristic is out of specification. The method may comprise the steps of sensing the occurrence of the EOL condition and changing to an alternate mode of operation of the laser light source whereby light is continued to be provided to the utilization tool for a period of time with a light characteristic that is in specification yet with a reduced energy level to avoid an unscheduled shutdown. The sensing of the EOL condition may comprise sensing one or more output light characteristics being out of specification. Continued delivery of light, although with a reduced energy level, allows the utilization tool to continue to operate in a modified alternate mode of operation.

The method may also comprise sensing second through nth occurrences of the EOL condition whereby the laser light characteristic is successively adjusted with a further reduced energy level. When such further second through nth EOL conditions are sensed, the programmable device changes to a respective second through nth alternate modes of operation of the laser light source whereby the light with the further reduced energy level is continued to be provided to the utilization tool to avoid an unscheduled shutdown. The alternate modes of operation enable a scheduled maintenance shutdown for the laser light source or the utilization tool to be reached.

In one embodiment, the output pulse energy is controlled by modifying discharge voltage due to a sensed EOL condition, for example voltage approaching a limit such that it cannot continued to be raised to compensate for a decreasing output pulse energy or out-of-specification output pulse energy stability. The laser controller is programmed to then deliver a lower output pulse energy than the utilization tool is calling for, but which lower output is still useable by the utilization tool. Compensation of the laser system output allows for the continued operation of the utilization tool until shutdown for a regularly-scheduled laser system or utilization tool maintenance can be performed, or alternatively allows for rescheduling a laser system or utilization tool maintenance to a later time.

Such alternate modes of operation can be implemented entirely within the laser light source controller without notification of the utilization tool if the utilization tool can itself account for the modified laser system output parameter, such as by reducing throughput rate of the scanner because the dose available is decreased by lower laser system output pulse energy. Further the alternate modes of operation could be commanded by the utilization tool controller and the laser system delivering light in accordance with such command, e.g., at a reduced output pulse energy. Further still, the alternate modes of operation could be delivered under laser system controller control with some notification to the utilization tool that an alternate mode is in effect together with details of the corrective action addressing the specific EOL condition(s).

The alternate mode(s) may be a one-time operation or may occur in multiple steps, such as an initial correction factor (typically 0.95) followed by a second such as 0.90, and others 0.85, etc. The present disclosure discusses correction factors in equal increments, but that need not be the case. Each of these steps could be implemented in one of the above-noted laser system or utilization tool controller interfaces, or some combination of them for different successive steps.

The present disclosure can also be viewed as providing methods for maintaining operation of a laser having a laser chamber or other component or output parameter at or near an EOL condition. One embodiment of such a method, among others, can be broadly summarized by the following steps: setting a pulse energy output level for the laser; providing a discharge voltage for each laser pulse to approximately achieve the pulse energy output level; monitoring a characteristic of the laser; and applying a first correction factor to diminish the pulse energy output level for the laser approximately when the characteristic of the laser meets or exceeds a prescribed value.

The tool utilizing the laser light source can be enabled to reach a regularly-scheduled maintenance shutdown while operating at a lower throughput until that point or, alternatively, to recognize that applying the correction factor or a series of applications of a plurality of correction factors will not reach the time for the next scheduled maintenance down time and to reschedule the scheduled down time accordingly. In either event this avoids an unscheduled downtime from occurring due to an unanticipated hard error alarm or automated shutdown (e.g., upon the occurrence of an EOL condition).

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWING

The present disclosure can be better understood with reference to the following figures. The components in the figures are not necessarily to scale, emphasis instead being placed upon clearly illustrating the principles of the present disclosure. Moreover, in the figures, like reference numerals designate corresponding parts throughout the several views.

DETAILED DESCRIPTION

A system and method are disclosed for controlling a photolithography laser light source experiencing an end of a life ("EOL") condition which might otherwise cause the laser light source or the utilization tool to be shut down. Instead, rather than incur an unscheduled shutdown, the laser system is operated in a diminished capacity by, in one embodiment, reducing the pulse energy output level in one or more increments. This continues until the laser system can undergo appropriate maintenance either during a regularly scheduled shutdown or a newly scheduled shutdown. In the meantime, the diminished capacity of the laser system is accommodated by the utilization tool, as explained further herein.

Figure 1:
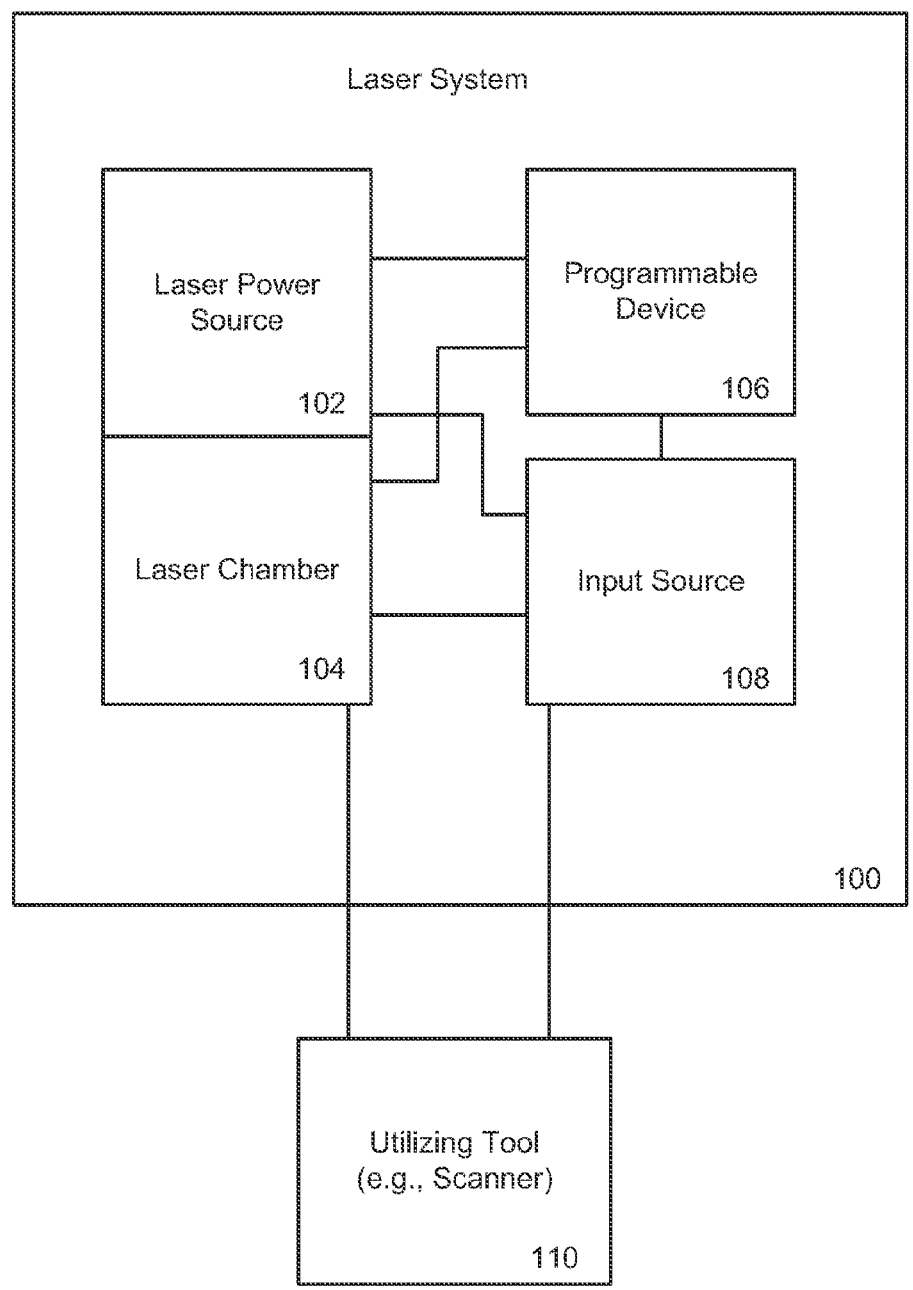
FIG. 1 is a block diagram illustrating a laser system for maintaining operation of a laser having a laser chamber at an end of life condition, in accordance with a first exemplary embodiment.

FIG. 1 illustrates a laser system 100 for maintaining operation of a laser having a laser chamber 104 at or near an EOL condition, in accordance with a first exemplary embodiment. Laser system 100 contains a programmable device 106, such as a programmed laser system controller, in communication with a laser power source 102. Programmable device 106, alone or in combination with other elements, controls a pulse energy output level for the laser system 100 by directing the laser power source 102 to provide the requisite power to generate the desired pulse energy output level from a laser chamber 104.

An input source 108 is coupled to the output of laser chamber 104 and/or to laser power source 102. Input source 108 may be any known device used to measure one or more characteristic of laser power source 102 and/or laser chamber 104. For example, in one embodiment input source 108 is a photodiode which detects the output pulse energy from laser chamber 104. Input source 108 is further coupled to programmable device 106 to communicate that measured data to programmable device 106. Input source 108 may also communicate the status of laser power source 102 and/or laser chamber 104, and/or a change or trend in a characteristic corresponding to any of them, to programmable device 106. Alternatively, programmable device 106 can itself determine such status or change in status based on one or more values of characteristics of laser system 100 operation received from input source 108.

Programmable device 106 compares the value(s) or status against preprogrammed value(s) or status to determine whether an EOL condition is occurring in laser system 100. Once an EOL condition has been determined, programmable device 106 causes a reduction in the pulse energy output level by a predetermined or calculated amount. This is accomplished by programmable device 106 communicating such a reduction to laser power source 102. In response, laser power source 102 delivers a reduced voltage to laser chamber 104 (specifically, the discharge voltage between the electrodes in laser chamber 104). As explained elsewhere herein, a tool utilizing the laser system, such as scanner 110, adjusts for the reduced pulse energy output level thus avoiding an unscheduled shutdown.

In one embodiment, a nominal correction factor ("NCF"), typically initially set to a value of 1.0, is programmed into programmable device 106. Under normal operating conditions the pulse energy output level is set at NCF*ES (Energy Setpoint) where NCF is the nominal correction factor of 1.0 and ES is the normally specified energy setpoint. A first correction factor ("CF1") is also programmed into programmable device 106 that is some fractional increment or value less than the nominal correction factor NCF, for example, 0.95. In this way, when an EOL condition occurs, the pulse energy output level is reduced by being set at CF1*ES. Additional correction factors, CF2, CF3, etc., can also be programmed into programmable device 106 to further reduce the pulse energy output level as needed, as described elsewhere herein.

The monitored and controlled characteristic may be any attribute of the laser system 100 that may be used to recognize an increasing possibility of arcing in the laser chamber 104 or other EOL condition. For example, the characteristic may be a difference in pulse energy output level from the laser chamber 104 measured against a difference in voltage from the laser power source 102. As the laser chamber 104 wears, debris develops within laser chamber 104 and halogen gas becomes depleted. To maintain a stable pulse energy output level from the depleted gas, the voltage from the laser power source 102 must be increased. Thus, for example, measuring the change in pulse energy output level from the laser chamber 104 against changes in the discharge voltage from the laser power source 102 can be an effective characteristic for detecting or predicting an EOL condition, such as arcing. Alternatively, electrode erosion that distorts the discharge profile between the electrodes in laser chamber 104, could require a replacement of laser chamber 104. In either event, however, the condition would normally cause the utilization tool to be shut down, and detrimentally so, if the occurrence of the EOL condition is not managed according to the present invention.

As explained, when programmable device 106 determines from the data that a particular characteristic corresponds to (e.g., has met, exceeded or is about to exceed) a prescribed maximum or threshold value, or is trending in such direction indicating an EOL condition is occurring, programmable device 106 acts to diminish the characteristic. In the above-described example, programmable device 106 applies correction factor CF1 to reduce the pulse energy output level hence reducing the discharge voltage commanded from laser power source 102 and supplied to laser chamber 104.

Programmable device 106 may also alert an operator of laser system 100 that laser chamber 104 is providing an output with a diminished characteristic and requires replacement or other maintenance requiring a shutdown. Such an alert allows the laser or utilization tool operator to delay the downtime long enough to reach a regularly-scheduled downtime. Alternatively the alert enables the laser or utilization tool operator to reschedule an upcoming regularly-scheduled downtime so that it will occur sooner. The alert can be via a warning light, a notice on a computer monitor, an electronic message sent to a master scheduler, or any other known output mechanism or means.

In one embodiment, the laser system's diminished capacity is by reducing the pulse energy output level. Even when receiving this lowered pulse energy output light pulse, the scanner can continue to operate while compensating for the reduced pulse energy. There are a number of ways the scanner can compensate for reduced laser pulse energy, including reducing the amount of attenuation applied to the beam in the scanner, or number of laser pulses used, or simply by utilizing a slower throughput if leeway for beam power attenuation is not available to the scanner.

Just as when lowering the output pulse energy still allows the user of the light energy (such as the scanner) to continue in operation, the scanner may tolerate the out of specification condition such as bandwidth and continue on using the laser light output from the laser light source regardless of the diminished quality of the light (bandwidth or bandwidth stability out of specification). Thus the utilization tool advantageously can similarly avoid an unscheduled shutdown for EOL conditions other than high voltage. For example, a scanner may be able to tolerate out of bandwidth or bandwidth stability conditions in the light source by rescheduling the scanner to temporarily be used only for processing wafers or wafer layers that do not require the delivery of light at the most restrictive specifications for bandwidth. Accordingly, an EOL operating mode may also be used where a parameter such as bandwidth is the EOL determinant and the benefits noted above regarding avoiding unplanned disruption of wafer production can be achieved.

In one embodiment, programmable device 106 is programmed with a plurality of correction factors, NCF, CF1, CF2, CF3, etc. In this way, each time a characteristic or trend achieves the prescribed maximum or threshold value or a separate prescribed value, e.g., as each new EOL condition for the current operating parameters occurs, programmable device 106 can apply the next correction factor to facilitate continued operation of laser source 100. For example, subsequent application of correction factors further diminishes the pulse energy output level thereby further extending the operating life of the laser gas in laser chamber 104.

For example, if CF1 is set at 5% less than NCF, or 0.95, once the first correction factor is applied the commanded energy setpoint becomes CF1*ES or 0.95*ES. Over time however, due to further gas depletion and buildup of debris, the discharging voltage again increases to maintain even the new reduced output pulse energy. At this point, if that would again cause an EOL condition to occur, the system may apply a subsequent correction factor, CF2, e.g., 0.90, thus further reducing output pulse energy level. In this way laser system 100 continues to operate albeit with a diminished laser light level. Similarly, the utilization tool continues to operate with acceptable effectiveness albeit with, e.g., a further reduction in throughput.

Following such operations, after some number of iterations the laser system would deliver a pulse energy output level below which further use of the utilization tool is unacceptable. To prevent this from occurring, the correction factors may continue to incrementally diminish the pulse energy output level, for example, in 5% or other increments until such an unacceptable level is reached, after which the laser gas or laser chamber 104 is then replaced at a new or previously scheduled shutdown.

Figure 2:
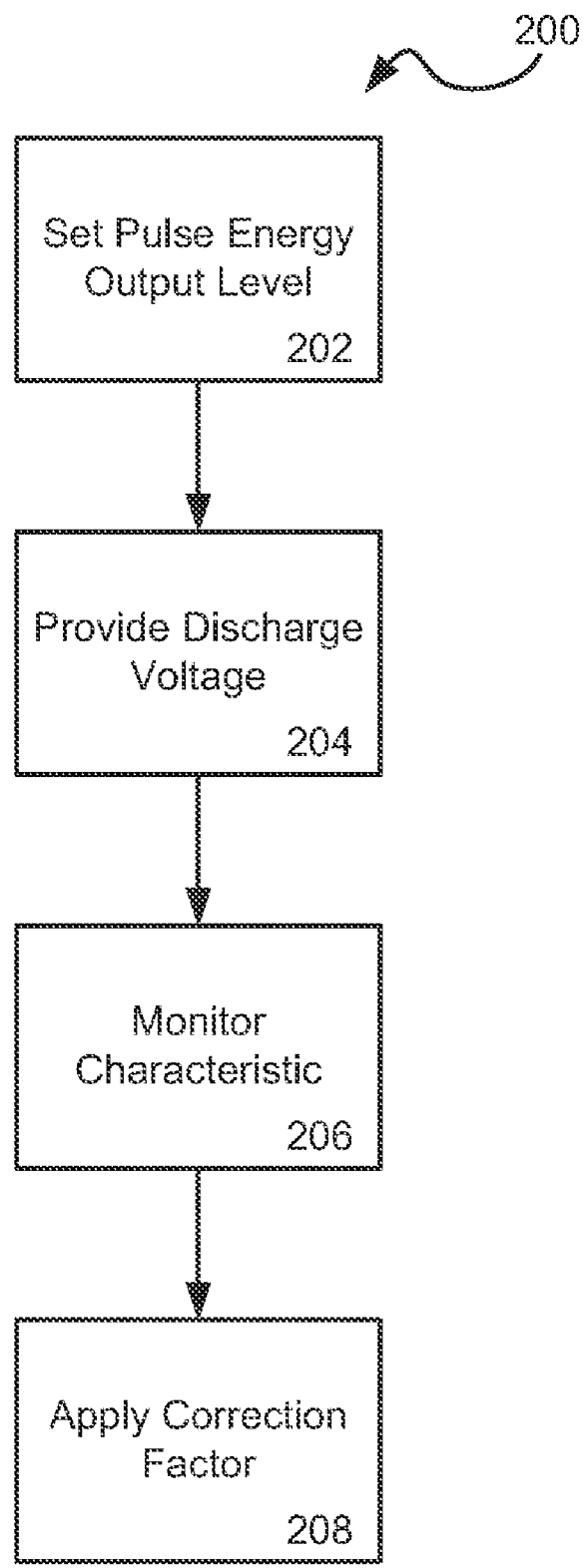
FIG. 2 is a flowchart illustrating a method for maintaining operation of a laser system having a laser chamber at an end of life condition, in accordance with the first exemplary embodiment.

Referring now to FIG. 2, shown is a flowchart 200 illustrating a method for maintaining operation of a laser system 100 with laser chamber 104 at the end of a life cycle, i.e., the occurrence of an EOL condition, in accordance with one embodiment.

As is shown by block 202, a pulse energy output level is set for laser system 100. In block 204, a discharge voltage is provided from laser power source 102 for each laser pulse to achieve the pulse energy output level. In block 206, a characteristic of the laser system 100 is monitored. This could be, e.g., discharge voltage, or a rate of change of discharge voltage over time or a rate of change of discharge voltage with respect to change in output pulse energy. In block 208, a first correction factor is applied to diminish the pulse energy output level for laser system 100 once the characteristic of laser system 100 corresponds to (meets, exceeds, or is about to exceed) a prescribed value, or there is an indication that it is about to meet or exceed some value, or that an unwanted laser operating characteristic normally associated with the excess value for the characteristic is about to occur, i.e., the system is experiencing an EOL condition.

An EOL condition can be defined in many ways as relating to a specific laser system component or output parameter that is determined to be soon or currently out of specification. Accordingly, an EOL condition as used in the present application simply means that the laser light source has reached or is about to reach some limit of an operating parameter or output parameter. The operating parameter or output parameter may be necessary to maintain the scanner within its own operational specifications, as is the case with bandwidth, or may affect the laser or scanner staying in specification, as is the case with voltage exceeding or about to exceed a high voltage limit. Alternatively, the EOL condition could be based on safety or system capabilities, such as the undesirability or inability of driving the power supply to provide higher voltage which may result in detrimental effects, such as arcing. The EOL condition could affect more than one laser system output parameter, for example both output pulse energy and bandwidth.

By way of another example in laser systems such as those described herein, bandwidth control is a function of a number of parameters of laser output, such as pulse energy and energy stability, wavelength stability, and bandwidth stability. As such, referring again to FIG. 1, in one embodiment programmable device 106 is programmed to manage one or more of such parameters, e.g., pulse energy as laser chamber 104 approaches an EOL occurrence, by monitoring the change of pulse energy with changing charging voltage (dE/dV) across the laser electrodes. Programmable device 106 can then detect if dE/dV changes more or less rapidly in one direction or the other, which can be used as an indication that laser system 100 is experiencing an EOL condition. Voltage increases in such systems may be based on the lithography or utilization tool (e.g., scanner 110) calling for more pulse energy as beam energy being delivered to the scanner drops. Utilizing Tool Scanner 110, depending on laser system/scanner interface being employed, may call for an increase in output pulse energy and allow programmable device 106 to command laser system 100 to deliver the increased output pulse energy, e.g., by commanding a voltage that will deliver an appropriate voltage between the electrodes. Scanner 110, in other modes, may itself demand a discharge voltage thus causing programmable device 106 to direct a voltage within laser power source 102 to be delivered, which will, in turn deliver the commanded discharge voltage to the electrodes in laser chamber 104. In yet another alternative, a controller of the utilization tool (e.g., scanner) 110 may directly command the selected voltage for a next laser system output pulse.

As explained, in one embodiment programmable device 106 is programmed to apply a correction factor ("CF") equal to 0.95 the nominal value. Using this correction factor, programmable device 106 calculates a new command voltage that will deliver a discharge voltage that will, in turn, produce an output pulse energy of 95% of the commanded output pulse energy even though the utilization tool commands a selected laser system output pulse energy of 100%. Other embodiments are possible as noted above, such as where the utilization tool itself, in response to an EOL condition such as an alarm from the laser system controller, may change its commanded output pulse energy to some lower value with which it can still operate, such as 95% of what it would normally command. In such a case the utilization tool applies the correction factor of 0.95.

It is to be understood that the timing of when each level of correction factor is introduced into each newly calibrated measure of the EOL occurrence will depend on several factors including but not limited to 1) the parameter being used as the EOL occurrence determining characteristic, 2) the ability of the laser system to maintain the determining characteristic at the current level for a time before the next correction factor needs to be implemented, 3) the ability of the utilization tool (e.g., scanner) to attain an acceptable level of continuing operation if the next level of correction factor is implemented, and 4) the relationship of all of this to the current maintenance schedule for the laser system or utilization tool. In this way, multiple correction factors can be implemented as long as the utilization tool can tolerate the reduced level of pulse energy, pulse energy stability, bandwidth, bandwidth stability, or whatever is the determining characteristic of the EOL condition, so as to continue diminished but still acceptable operation of the scanner until a regularly scheduled utilization tool or laser maintenance down time is reached, thereby avoiding an unscheduled shutdown.

A further benefit of the present approach is that the programmable device 106 can signal the utilization tool (e.g., scanner) controller that the laser system is operating in a diminished capacity, and in a further embodiment also determine and indicate the remaining time the laser system can continue to operate in a diminished capacity, thereby allowing the scanner controller and/or scanner operator or both to determine acceptable conditions for operation (e.g., with reduced throughput), and timing to reschedule a planned maintenance downtime occurrence. In one embodiment, laser system 100 first makes a request of scanner 110 or other utilization tool for laser system 100 to operate in a diminished capacity and then waits for the request to be granted by scanner 110 or other utilization tool before operating in such diminished capacity, as explained further elsewhere herein.

Figure 3:
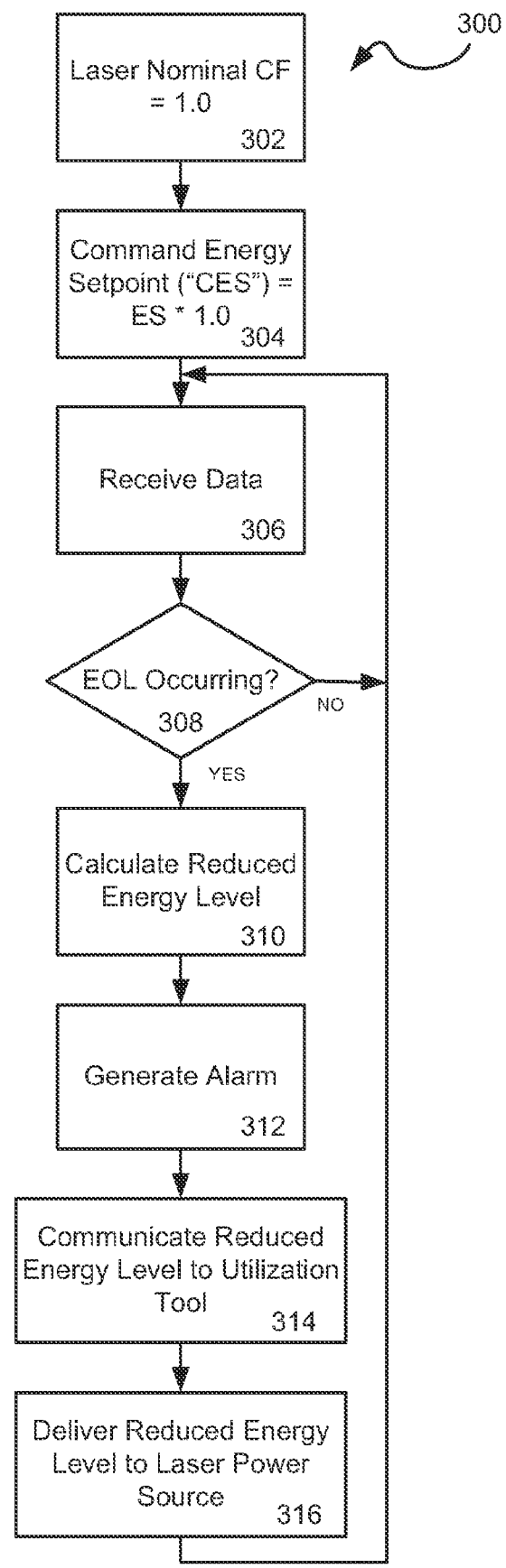
FIG. 3 is a block diagram illustrating a method for maintaining operation of a laser system experiencing an end of life condition, in accordance with a second exemplary embodiment of the disclosure.

Referring now to FIG. 3, shown is an exemplary laser system 100 controller program 300 flowchart which may operate as described to extend laser system output life beyond an occurrence of an EOL condition. Controller program 300 flowchart depicts in greater detail one embodiment of the process as described with reference to FIG. 2.

In block 302 programmable device 106 is operating with inputs indicating that laser chamber 104 is operating under nominal conditions. For purposes of FIG. 3, the output pulse level of programmable device 106 is controlled by the controller of scanner 110 utilizing laser system 100 as the scanner light source and programmable device 106 sets the commanded energy setpoint ("CES") as CES=ES*NCF, where NCF is initially set to 1.0 as indicated in block 304.

In block 306, programmable device 106 receives data, such as voltage data, as described elsewhere herein. In block 308, this data is evaluated to determine if an EOL condition is occurring. If an EOL condition is not occurring, the process returns to block 306 to receive additional data for evaluation. Alternatively, if an EOL condition is occurring then, in block 310, programmable device 306 determines a reduction in energy level that will still allow for continued operation. In one embodiment, in order to minimize the impact of energy changes, programmable device 106 is programmed with correction factors that cause energy changes that are incrementally small yet still large enough to support continued operation of the laser system and scanner.

In block 312, laser system 100 generates an alarm such as on a diagnostic channel for provision of this information to the scanner controller and/or scanner operator, such as on a diagnostic interface or scanner interface in external High Voltage ("HV") mode. In one embodiment, this alarm is a request, referred to herein as a "Derating Request," by laser system 100 to scanner 110 for laser system 100 to move to a reduced or de-rated energy level.

In block 314, in response to laser system 100 receiving approval from scanner 110 for the Derating Request, programmable device 106 communicates the new output pulse level to scanner 110 so that scanner 110 can expose wafers appropriately. One example of communication of output pulse level to scanner 110 is explained further elsewhere herein.

In block 316, programmable device 106 delivers the new output pulse energy level to laser power source 102. The process then returns to receiving data in block 306.

Figure 4:
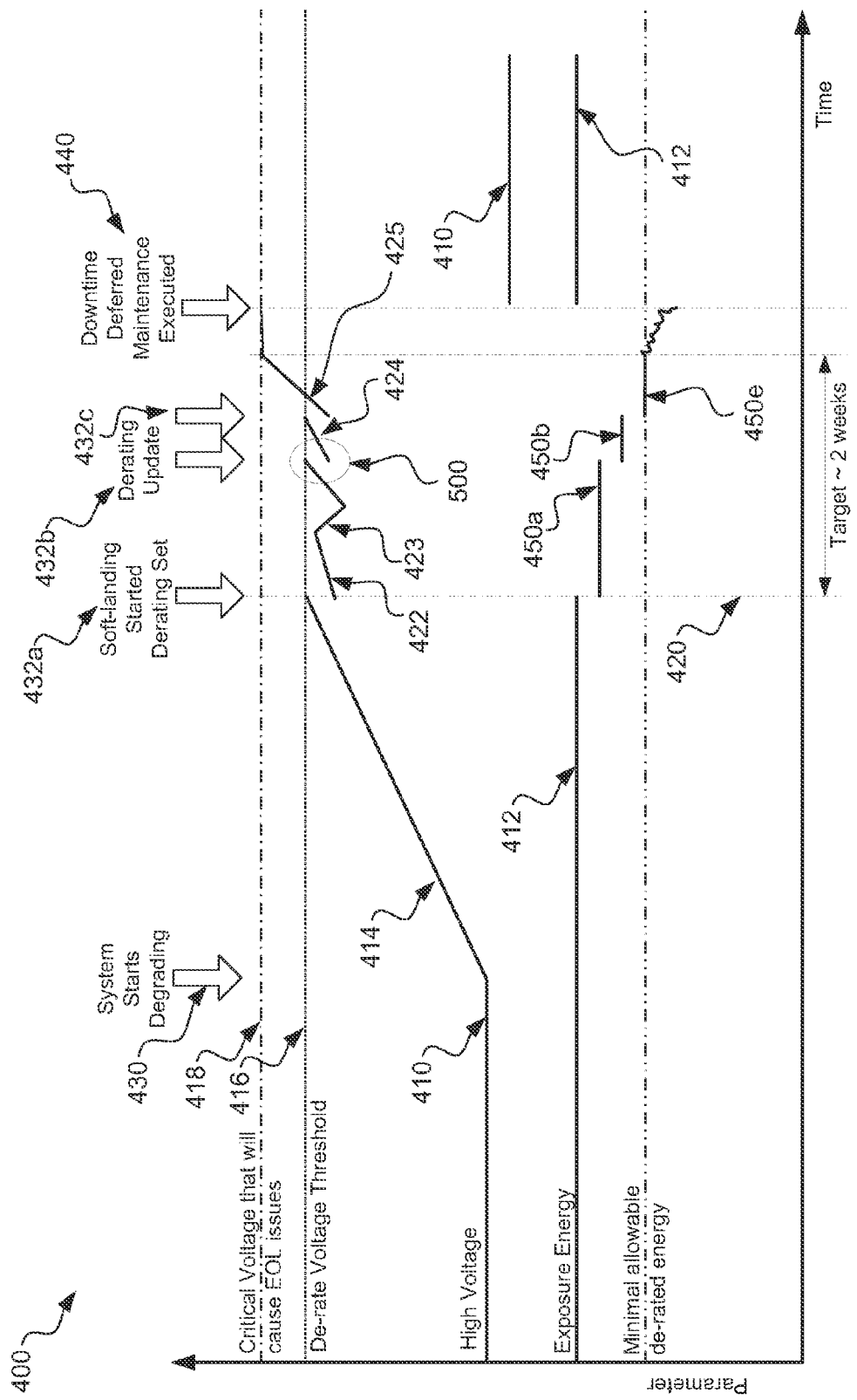
FIG. 4 shows a graphical illustration of the operation of a laser system in operation according to an embodiment of the claimed subject matter.

FIG. 4 shows graphically an illustrative operation of a photolithography laser light source system 100 in operation and dealing with an EOL condition according to one embodiment. The graph of FIG. 4 shows the laser system initially running normally with a set high voltage 410 well below a de-rate voltage threshold 416 selected, as noted above according to system design, as at least one measure of an EOL condition and, as shown, below a critical voltage 418 that will cause a hard shutdown EOL condition. The high voltage 410 maintains the laser light source system 100 output pulse energy, also as explained above, so that the exposure energy 412 is maintained constant. Dose to the wafer in the scanner and dose energy stability are under normal control, and as indicated by the steady value for exposure energy 412, the controller 106 of the laser system 100 is maintaining dose energy.

At a point in time, indicated by arrow 430, the system operation begins degrading and consequently the laser discharge voltage is raised, as indicated by portion 414 of the voltage curve, to maintain exposure energy 412. As indicated above, there are a variety of ways in which this can be made to happen, including the laser system controller 106 internally reacting to a command from the scanner to maintain the exposure energy 412, or the scanner commanding the discharge voltage, or some combination of commands and actions by the laser system controller 106 and/or the scanner controller together. As noted above this requirement for increased discharge voltage can and usually does result from decreasing fluorine content and increased debris in the laser gas in the laser chamber 104.

At a later point in time an EOL condition occurs at arrow 432a. Again as noted above, there are various ways to define the EOL condition. As illustrated, the de-rate voltage threshold 416 is below the critical voltage level 418 to provide some level of safety margin to prevent ill effects of the EOL event actually occurring, or alternatively the critical voltage level 418 could have that safety margin already built in and the voltage transient 414 allowed to hit that critical voltage level 418 before an EOL condition is considered to be occurring.

As illustrated, when an EOL condition occurs, the laser system controller 106 applies a correction factor, e.g., CF1=0.95, to the exposure energy and the laser system 100 begins to deliver laser output pulses such that the exposure energy is reduced to 450a (e.g., exposure energy 412×0.95). Again as explained above, this can be done by the laser system controller 106 commanding a lower discharge voltage, by whatever means the laser system uses to control discharge voltage, e.g., a lower command voltage delivered to the power supply system, or otherwise.

In this portion 422 of the high voltage operating curve the discharge voltage has been initially stepped down to a reduced discharge voltage to deliver pulses with energy capable of maintaining an exposure energy level at 450a (e.g., exposure energy 412×0.95). As indicated, the voltage curve 422 will however continue to rise for essentially the same reasons as in region 414.

At a later point in time, the voltage will again approach the de-rate voltage threshold 416 or EOL condition. At this point, voltage again may be decreased, as illustrated by the portion 423 of the high voltage curve. In this example, this voltage decrease depicts a sudden increase of system efficiency due to, e.g., a change in utilization or a small maintenance activity such as gas optimization occurring. However, as before, the high voltage curve eventually again shows an increasing voltage to maintain the output pulse energy at 0.95 times the level 412. The voltage curve then begins to approach the region 500 of the illustrative graph of FIG. 4 expanded and shown in FIG. 5.

Figure 5:
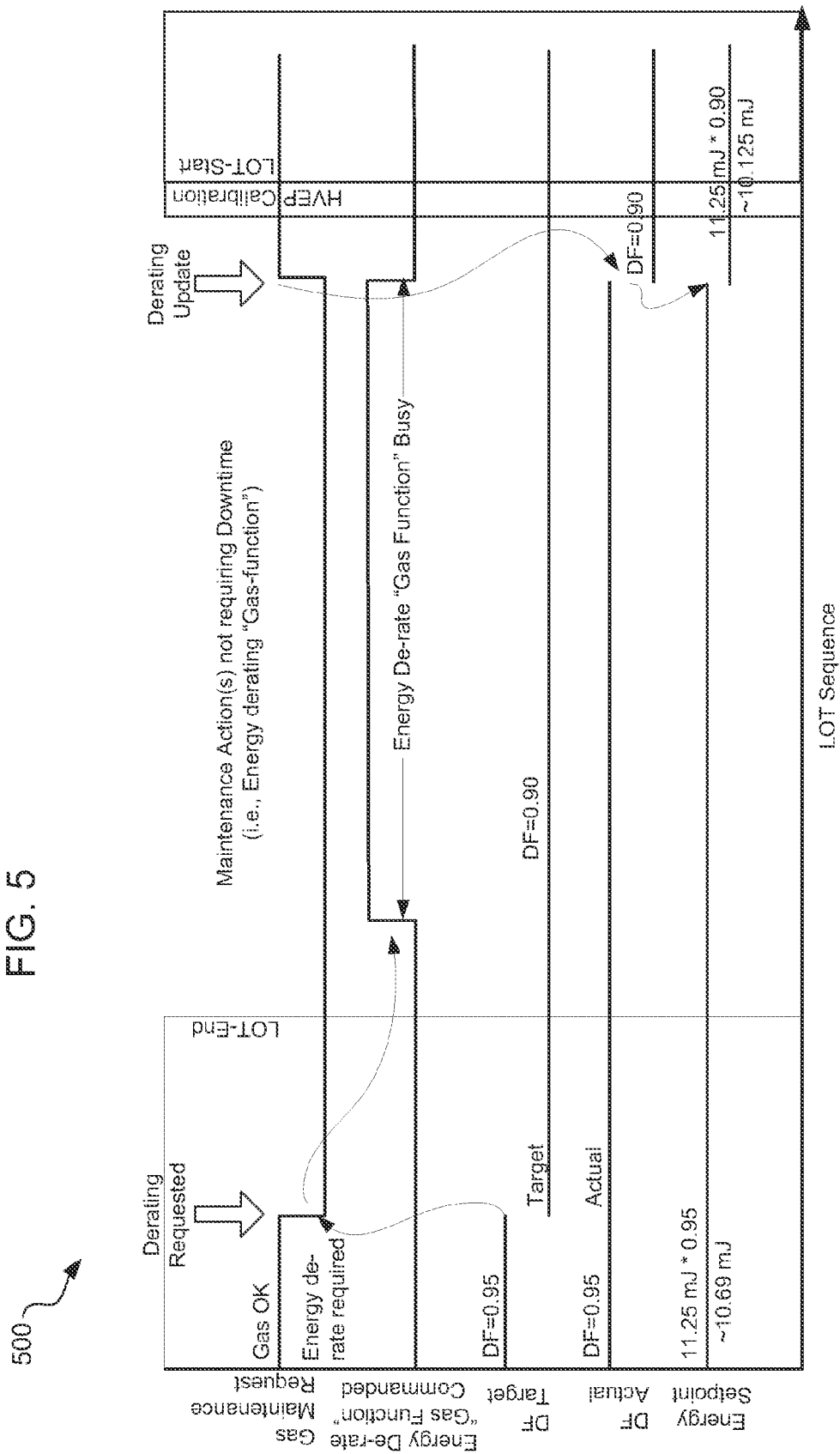
FIG. 5 shows an expanded graphical illustration of a portion of the graphical illustration of FIG. 4; and, FIG. 6 shows an expanded graphical illustration of a tool calibration sequence

Referring now to FIG. 5, shown is the expanded portion 500 of FIG. 4. In the example shown, scanner 110 is processing a wafer lot and laser system 110 issues a derating request to scanner 110. This derating request is triggered by high voltage curve 423 approaching the de-rate voltage threshold 416 of FIG. 4 causing a de-rating factor ("DF") target to change from 0.95 to 0.90. However, the energy setpoint will remain at its previously set level (e.g., 11.25 mJ*0.95, or 10.69 mJ, as shown in the figure) and a de-rating factor ("DF") actual will not change to correspond to DF target, until scanner 110 approves the derating request, as explained further herein.

Once scanner 110 completes processing the wafer lot (indicated as "LOT-End" in the figure) and any maintenance actions not requiring shutdown are performed, then scanner 110 approves the derating request, as indicated in the figure as "Derating Update." The DF actual is then changed to DF target, shown in the figure as the change from 0.95 to 0.90, which results in a reduction in the energy setpoint (e.g., 11.25 mJ*0.90, or 10.125 mJ), as shown in the figure.

However, before scanner 110 begins processing another wafer lot (indicated as "LOT-Start" in the figure), a High Voltage External Program ("HVEP") calibration operation is performed. This operation will now be explained with reference to FIG. 6.

During the HVEP calibration operation, scanner 110 commands an energy level for laser system 100 (e.g., 11.25 mJ as shown in the figure) and receives a confirming reply from laser system 100 that laser system 100 is operating at that commanded energy level (e.g., 11.25 mJ as shown in the figure). Scanner 110 then queries laser system 100 regarding the high voltage level being used to achieve the commanded energy level. Laser system 100 replies to the query, as shown in the figure as a reply of HV=995. Scanner 110 then commands another energy level for laser system 100 (e.g., 10.25 mJ as shown in the figure) and receives another confirmation from laser system 100 that it is operating at the commanded energy level (e.g., 10.25 as shown in the figure). Scanner 110 again queries laser system 100 as to what is the high voltage level being used to achieve this commanded energy level. Laser system 100 replies to the query, as shown in the figure as reply of HV=975.

This repeated sequence of commanded energy level from scanner 110 and reporting by laser system 100 of high voltage level being used provides scanner 110 with the information needed to calculate a de-rated dE/dV parameter. In this way, during subsequent processing of another wafer lot (shown in the figure as "LOT-Start"), scanner 110 uses the calculated de-rated dE/dV parameter to later command its desired energy level despite being unaware of any de-rated energy setpoint change within laser system 100. This is shown, for example, in the figure where despite scanner 110 commands an energy level of 11.25 mJ, yet the actual energy level is 10.125 mJ due to the derating factor of 0.90 (11.25 mJ*0.90=10.125 mJ).

Referring again to FIG. 4, with Derating Update 432b approved by scanner 110 which has performed an HVEP calibration operation and moved into processing another wafer lot as shown by FIGS. 5 and 6, high voltage curve 424 again approaches de-rate voltage threshold 416 as it moves from a lower voltage level to a higher voltage level just as high voltage level 414 and 422 did. As before, this results in a lowering of exposure energy from 450b to 450c as shown. This process is essentially repeated by reference to high voltage level 425 and exposure energy 450e in the figure until a minimum allowable de-rated energy level or a scheduled or rescheduled maintenance shutdown is reached.

The delay in time to an originally scheduled or rescheduled shutdown is shown as being two weeks in the illustrative example of FIG. 4.

As shown in the graph of FIG. 4, an EOL condition can occur one or more times (e.g., at arrows 432a, 432b and 432c) until a point in time represented by arrow 440 where a regularly scheduled or newly rescheduled down time for the laser light source system or scanner or both is reached.

It is understood that the initial high voltage curve 410 in the graph of FIG. 4 is idealized and will actually have many small transients followed by voltage reductions at or near the level 410 depending on the gas control system being used and the nature and size of injections being made to account for fluorine content changes during normal laser light source system operation. Such operation may occur for some time (several billion pulses) before the portion of the high voltage curve 414 leads to an EOL condition, i.e., a first EOL condition at arrow 432a.

As described, the method may comprise sensing the occurrence of the EOL condition, e.g., by monitoring voltage (discharge voltage or some commanded or resultant voltage utilized to attain a discharge voltage for the desired output pulse energy), and switching to an alternate mode of operating the laser light source. The alternate mode of operation continues to deliver in specification light to the utilization tool, albeit with a reduced energy level, for a period of time to avoid an unscheduled shutdown. This allows the utilization tool to continue to operate.

The method may also comprise sensing a second through nth occurrence of the EOL condition whereby the laser light output characteristic that is in specification and with a successively further reduced energy level, e.g., as illustrated in the example of the graph of FIG. 4 whereby the further reduced energy level light is continued to be provided to the utilization tool for a second through nth period of time to avoid an unscheduled shutdown. Again, as illustrated in the example of the graph of FIG. 4, this could comprise the successive drops in output pulse energy in the periods 450a-e. One of the first through nth periods of time allows a scheduled or rescheduled maintenance down time for the laser or the utilization tool to be reached.

It should be noted that any process descriptions or blocks in flow charts should be understood as representing modules, segments, portions of code, or steps that include one or more instructions for implementing specific logical functions in the processor, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

Thus the present disclosure allows the laser light source system to continue in operation under conditions that in the past would have normally caused a specific EOL condition and a related EOL error, due, e.g., to deterioration in such light source output parameters as noted above, or laser operating parameter errors such as high voltage error, and the like, to cause an unscheduled shutdown.

Other EOL conditions can be imagined, or may become of importance in the future, and are considered to be within the scope of the present disclosure and following claims. Other laser system output characteristics/parameters and their determining operating characteristics/parameter(s) may be the subject of EOL conditions with which the claimed subject matter could be useful. As an example, selected bandwidth and/or the ability to keep the bandwidth of the pulses stable over a burst or many successive bursts could be a determining output characteristic/parameter defining an EOL occurrence. That is, an EOL condition can be considered to have occurred whenever an element or subsystem used by the laser system to maintain or improve bandwidth, such as optical elements, gas control, differential firing time between chambers in a seed laser/amplifier laser system, or combinations thereof, is no longer able to maintain bandwidth per required specifications, or is about to reach that point. Such EOL conditions are no different from the EOL condition resulting from voltage increases not being able to maintain output pulse energy as fluorine concentration decreases with the accumulated level of debris.

Whether the laser system or scanner controller is programmed to respond with some safety margin is a matter of design choice. The safety margin may be built in by selection of the threshold value(s) at which the alarm or shutdown command or the like is issued. The safety margin may be included by evaluating data that indicate a predicted time of exceeding whatever limit is in question and issuing the alarm or shutdown order or the like at some selected time or threshold value in advance of the predicted occurrence. Therefore such details are not relevant to the scope of the claimed subject matter.

It should be emphasized that the above-described embodiments of the present disclosure are merely possible examples of implementations, merely set forth for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure and the present disclosure and protected by the following claims.

What is claimed is:

1. A method for operating a laser light source having a laser chamber at or near an end of a life condition, the method comprising the steps of:
setting a pulse energy output level for the laser chamber;
providing a discharge voltage for each laser pulse to approximately achieve the pulse energy output level;
monitoring a characteristic of the laser light source; and
applying a first correction factor to diminish the pulse energy output level if the characteristic of the laser light source corresponds to a prescribed value indicative of the end of life condition.

2. The method of claim 1, further comprising the steps of:
continuing to monitor the characteristic of the laser light source after a first correction factor has been applied; and
applying a second correction factor subsequent to the application of the first correction factor to again diminish the pulse energy output level for the laser light source if the characteristic of the laser light source again corresponds to the prescribed value indicative of the end of life condition.

3. The method of claim 1, wherein monitoring the characteristic of the laser further comprises comparing a change in the pulse energy output level against a change in the discharge voltage.

4. The method of claim 1 wherein the characteristic comprises an indication that an end of life condition for a laser gas in the laser chamber is occurring.

5. The method of claim 1 wherein the characteristic comprises an indication that an end of life condition for a laser gas or the laser chamber is about to occur.

6. A system for controlling operation of a laser light source having a laser chamber at or near an end of life condition, the system comprising:
a programmable device coupled to a laser power source for controlling a pulse energy output level, wherein the programmable device is programmed with an initial pulse energy output level and a first correction factor;
an input source coupled to the programmable device for communicating a status of a characteristic of the laser light source to the programmable device;
and wherein a prescribed value of the characteristic of the laser light source is programmed into the programmable device, the prescribed value indicative of the end of life condition and the programmable device is programmed to diminish the pulse energy output level by the first correction factor when the communicated status corresponds to the prescribed value.

7. A method of controlling a photolithography laser light source coupled to a utilization tool to prevent an unscheduled shutdown when an end of life condition occurs, the photolithography laser light source when operating in a first mode of operation producing light for the utilization tool with a light characteristic that is in specification, comprising the steps of:

sensing when the end of life condition occurs;

receiving a signal from the utilization tool indicating approval for the photolithography laser light source to operate in a second mode of operation producing light for the utilization tool with a light characteristic that is in specification and with a reduced energy level;

adjusting the photolithography laser light source to the second mode of operation producing light for the utilization tool with a light characteristic that is in specification and with the reduced energy level;

the photolithography laser light source continuing to provide the light for the utilization tool with a light characteristic that is in specification and with a reduced energy level for a period of time to prevent the unscheduled shutdown.

8. The method of claim 7 further comprising:

sensing an nth occurrence of the end of life condition;

switching to an nth mode of operation of the laser light source whereby light is continued to be provided to the utilization tool for n successive periods of time with a light characteristic that is in specification and with a successively further reduced energy level to avoid an unscheduled shutdown.

9. The method of claim 7 further comprising:

sensing the occurrence of the end of life condition by sensing the output light characteristic being out of specification.

10. The method of claim 9 further comprising:

sensing an nth occurrence of the end of life condition;

switching to an nth mode of operation of the laser light source whereby light is continued to be provided to the utilization tool for n successive periods of time with a light characteristic that is in specification and with a successively further reduced energy level to avoid an unscheduled shutdown.

11. The method of claim 10 further comprising:

the nth period of time runs until a scheduled maintenance down time for the laser or the utilization tool is reached.

\* \* \* \* \*